(12) United States Patent
Eklund

(10) Patent No.: US 8,264,015 B2
(45) Date of Patent: Sep. 11, 2012

(54) SEMICONDUCTOR DEVICE WHEREIN A FIRST INSULATED GATE FIELD EFFECT TRANSISTOR IS CONNECTED IN SERIES WITH A SECOND FIELD EFFECT TRANSISTOR

(76) Inventor: Klas-Håkan Eklund, Manhemsvägen (SE)

( * ) Notice: Subject to any disclaimer, the term of this patent is extended or adjusted under 35 U.S.C. 154(b) by 224 days.

(21) Appl. No.: 12/667,088

(22) PCT Filed: Apr. 3, 2009

(86) PCT No.: PCT/SE2009/050350
§ 371 (c)(1),
(2), (4) Date: Mar. 31, 2010

(87) PCT Pub. No.: WO2009/123559
PCT Pub. Date: Oct. 8, 2009

(65) Prior Publication Data
US 2010/0327330 A1    Dec. 30, 2010

(30) Foreign Application Priority Data
Apr. 4, 2008    (SE) ...................................... 0800764

(51) Int. Cl.
| H01L 29/80 | (2006.01) |
| H01L 31/112 | (2006.01) |
| H01L 29/76 | (2006.01) |
| H01L 29/94 | (2006.01) |
| H01L 31/062 | (2006.01) |
| H01L 31/113 | (2006.01) |
| H01L 31/119 | (2006.01) |

(52) U.S. Cl. ........ 257/262; 257/341; 257/342; 257/398; 257/399; 257/400; 257/401; 257/E29.012; 257/E29.013; 257/E29.014; 257/E29.278

(58) Field of Classification Search .................. 257/262, 257/341, 342, 398, 399, 400, 401, E29.012, 257/E29.013, E29.014, E29.278
See application file for complete search history.

(56) References Cited

U.S. PATENT DOCUMENTS

| 4,546,401 | A | * | 10/1985 | Svedberg ..................... 361/91.8 |
| 4,877,976 | A | * | 10/1989 | Lach et al. .................... 326/117 |
| 5,250,833 | A | * | 10/1993 | Watanabe .................... 257/335 |
| 5,313,082 | A |   | 5/1994 | Eklund |

(Continued)

FOREIGN PATENT DOCUMENTS
EP    0 295 391    12/1988

OTHER PUBLICATIONS

International Search Report dated Jun. 16, 2009, from corresponding PCT application.

*Primary Examiner* — Ida M Soward
(74) *Attorney, Agent, or Firm* — Young & Thompson

(57) ABSTRACT

A semiconductor device in which a first insulated gate field effect transistor (1) is connected in series with a second field effect transistor, FET, (2), wherein the second field effect transistor (2) has a heavily doped source region (19A) which is electrically connected to a heavily doped drain contact region (191) of the first insulated gate field effect transistor, and further that the breakthrough voltage of the first insulated gate field effect transistor (1) is higher than the pinch voltage, Vp, of the second field effect transistor (2).

14 Claims, 7 Drawing Sheets

U.S. PATENT DOCUMENTS

Figure 1:
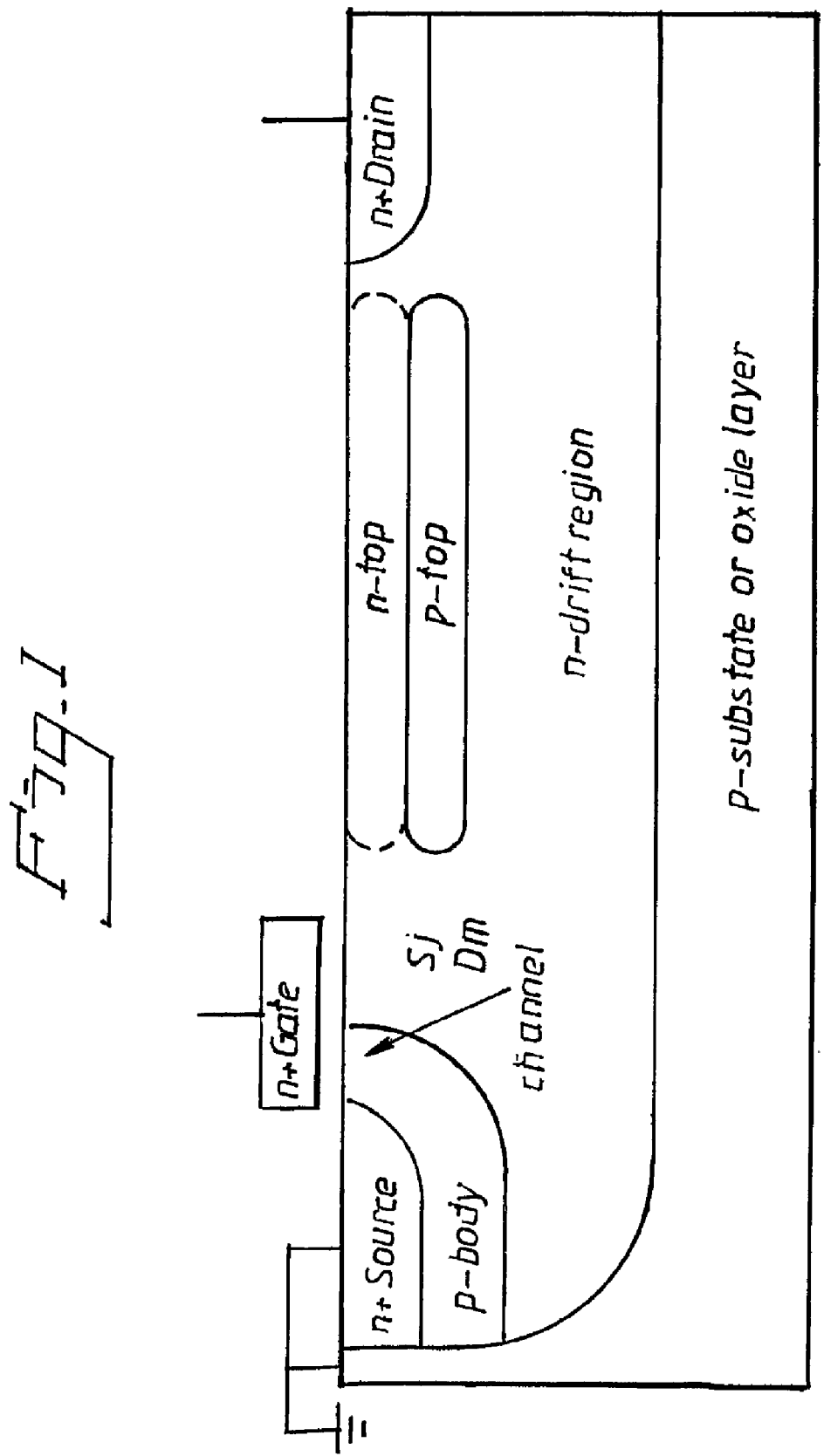

| | | | |
|---|---|---|---|
| 5,396,085 A | 3/1995 | Baliga | |
| 6,365,941 B1 * | 4/2002 | Rhee | 257/357 |
| 6,462,378 B1 * | 10/2002 | Kim | 257/342 |
| 6,633,195 B2 * | 10/2003 | Baudelot et al. | 327/430 |
| 6,639,277 B2 * | 10/2003 | Rumennik et al. | 257/342 |
| 6,784,048 B2 * | 8/2004 | Leung et al. | 438/239 |
| 6,861,704 B2 * | 3/2005 | Asada et al. | 257/336 |
| 7,294,885 B2 * | 11/2007 | Tihanyi et al. | 257/341 |
| 7,324,315 B2 * | 1/2008 | Harris | 361/58 |
| 7,696,556 B2 * | 4/2010 | Hur et al. | 257/315 |
| 7,719,054 B2 * | 5/2010 | Williams et al. | 257/335 |
| 2004/0140515 A1 * | 7/2004 | Yasukawa | 257/428 |
| 2005/0184317 A1 * | 8/2005 | Hatakeyama et al. | 257/262 |
| 2005/0280030 A1 * | 12/2005 | Sun et al. | 257/200 |
| 2006/0113600 A1 * | 6/2006 | Salling et al. | 257/360 |
| 2008/0197908 A1 * | 8/2008 | Williams | 327/431 |
| 2008/0211476 A1 * | 9/2008 | Chow | 323/303 |
| 2008/0237631 A1 * | 10/2008 | Watanabe | 257/141 |
| 2009/0267503 A1 * | 10/2009 | Kobayashi | 313/504 |
| 2010/0207925 A1 * | 8/2010 | Nakanishi | 345/211 |

* cited by examiner

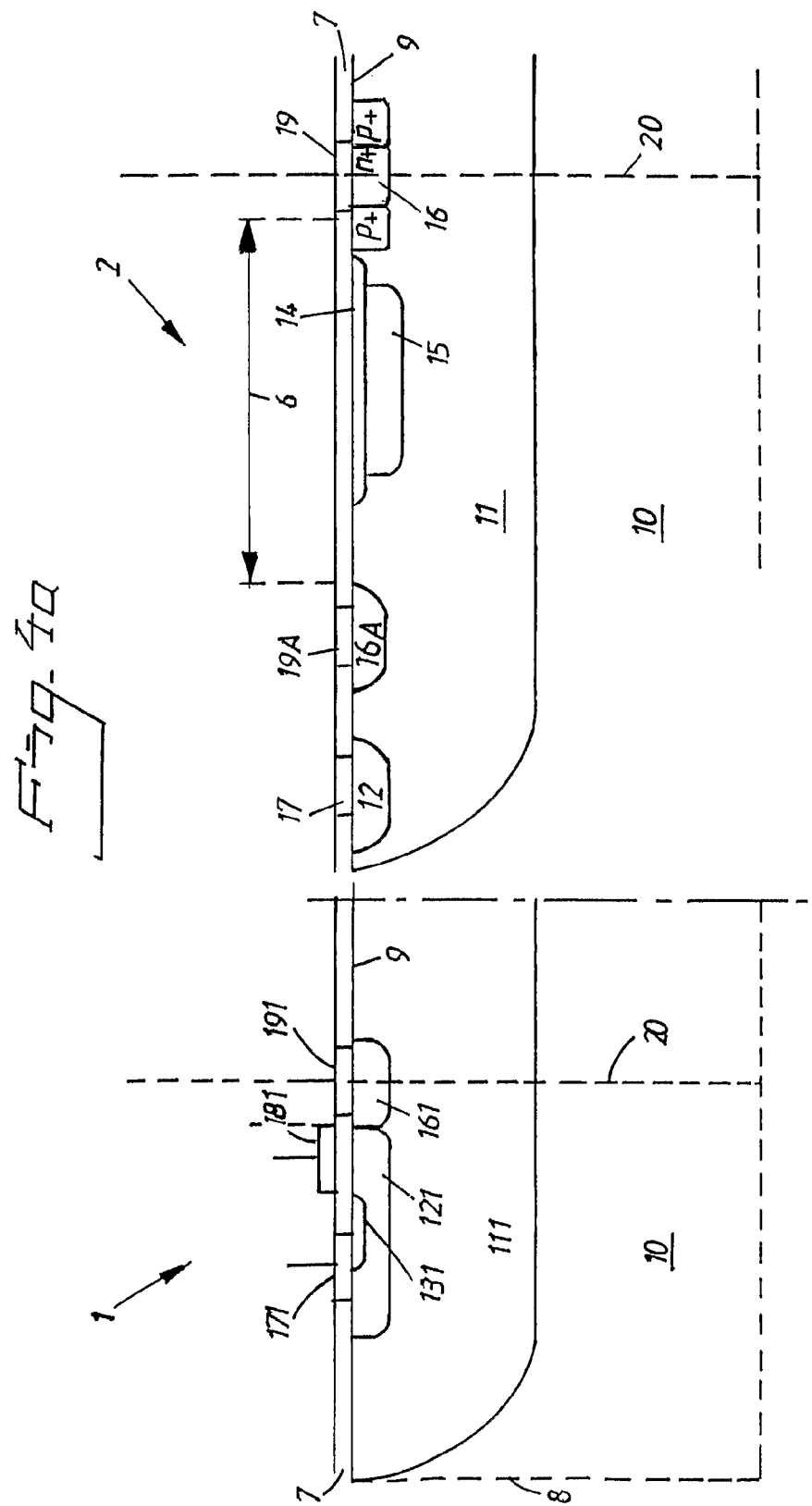

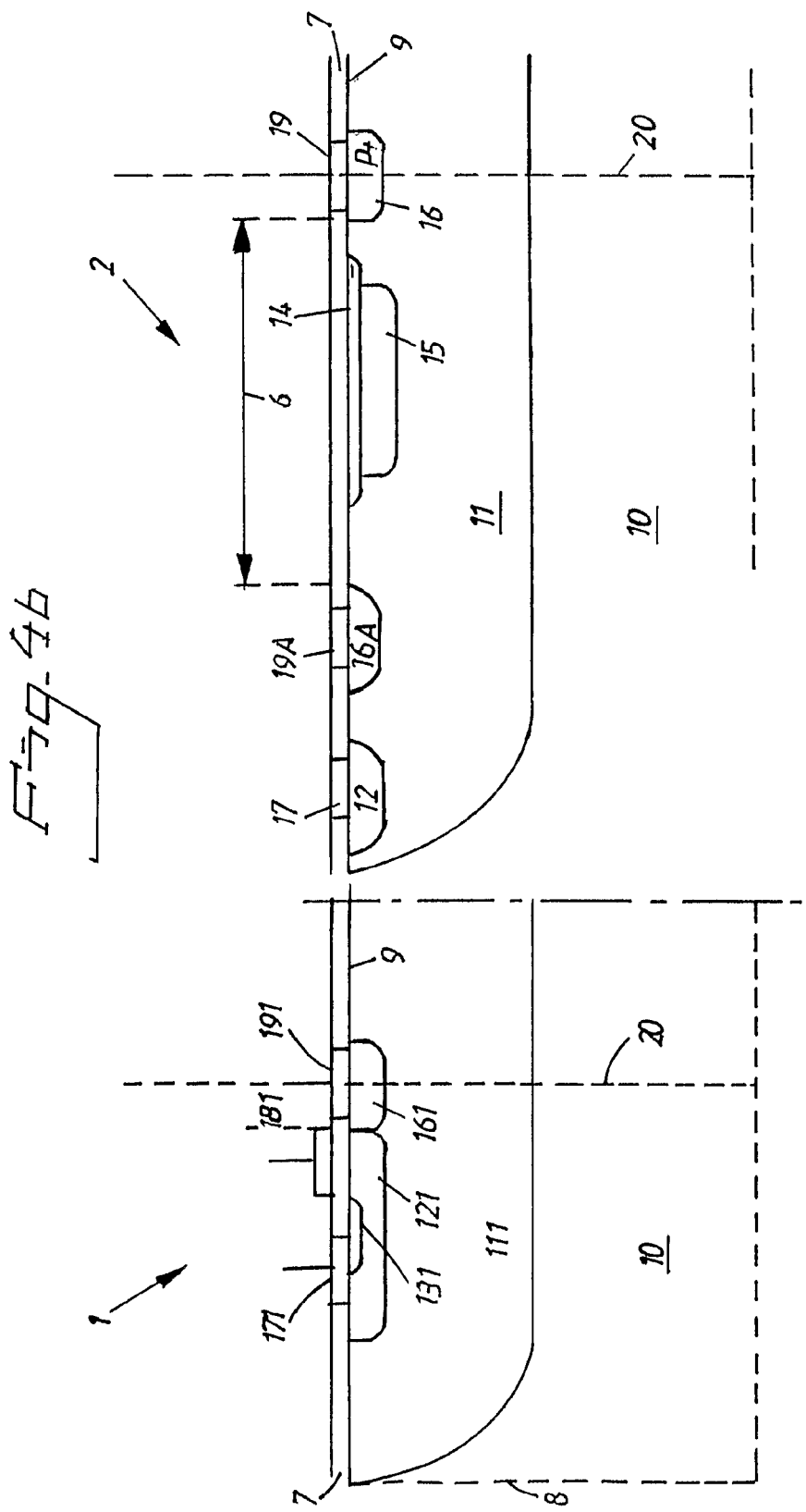

SEMICONDUCTOR DEVICE WHEREIN A FIRST INSULATED GATE FIELD EFFECT TRANSISTOR IS CONNECTED IN SERIES WITH A SECOND FIELD EFFECT TRANSISTOR

The present invention relates to a novel semiconductor device wherein a first insulated gate field effect transistor is connected in series with a second field effect transistor.

A high voltage and high current LDMOS transistor is a very common device used in smart power applications.

For such a device the importance of gate overlap over drift region for high current and low on-resistance has been presented by Sel Colak, "Effects of drift region parameters on the static properties of power LDMOS", IEEE transaction on electron devices, vol. ED-28 No. 12, pp 1455-1466 (Dec. 1981). Even if the gate overlap is very positive for having a high current and low on-resistance it causes a very high input-capacitance which varies a lot with gate voltage and limits the high frequency performance.

U.S. Pat. No. 5,396,085 by Baliga presents a series combination of a silicon MOSFET with a JFET, particularly a silicon carbide JFET where two discrete devices are bonded together to form a composite substrate of silicon and silicon carbide.

A problem with the above US patent is that it is difficult to integrate in a combined component on a substrate together with other components as it requires a high voltage and therefore an efficient cooling. It can not be used and combined with low voltage control functions.

It is therefore an object of the present invention to provide a novel semiconductor device wherein a first insulated gate field effect transistor is connected in series with a second field effect transistor which avoids the drawbacks of the above known components, and that allows a higher current, lower on-resistance and that requires lower power for functioning within a given area.

This object with the invention is obtained by means of a transistor of the above type, wherein according to the invention the second field effect transistor has a heavily doped source region which is electrically connected to a heavily doped drain contact region of the first insulated gate field effect transistor, and further that the breakthrough voltage of the first insulated gate field effect transistor is higher than the pinch voltage, Vp, of the second field effect transistor.

Figure 2:
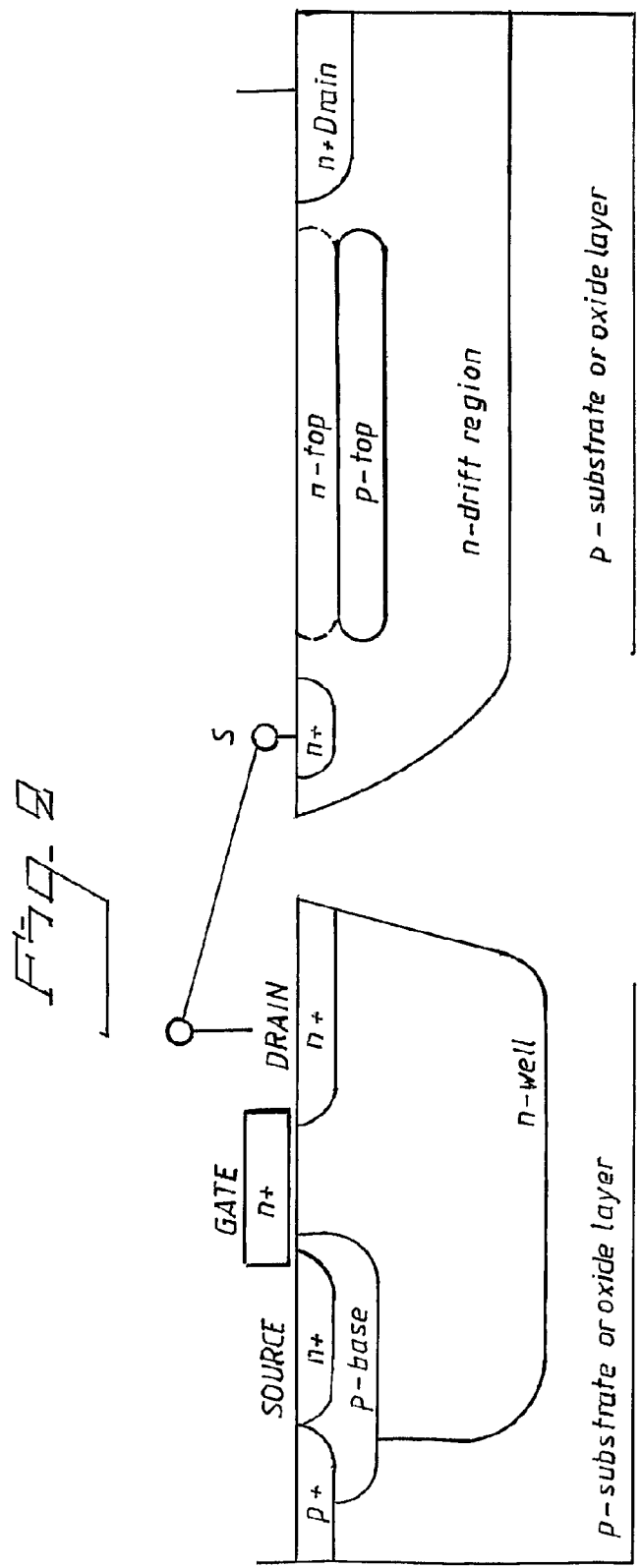
Figure 3:
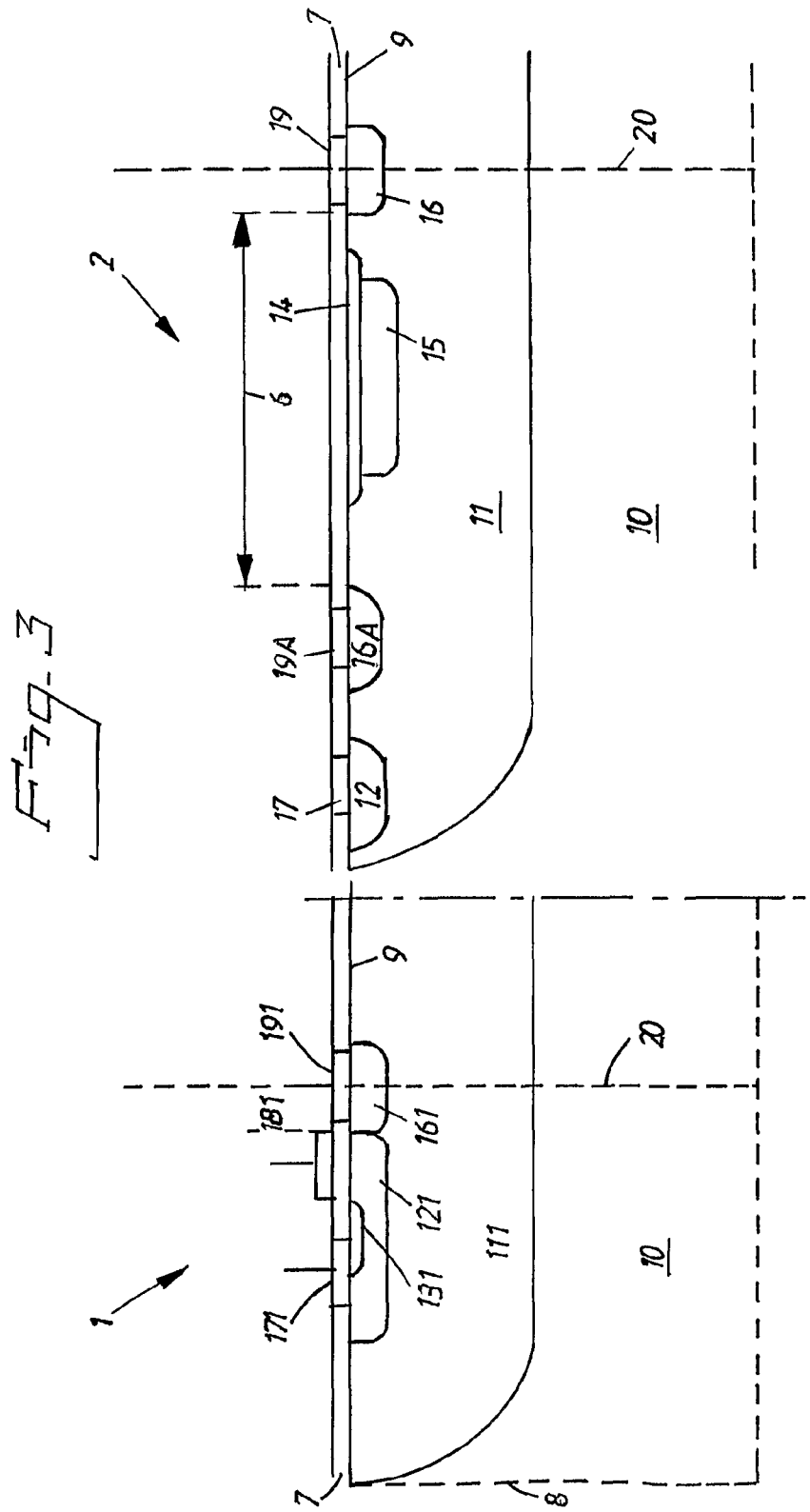
Figure 5A:
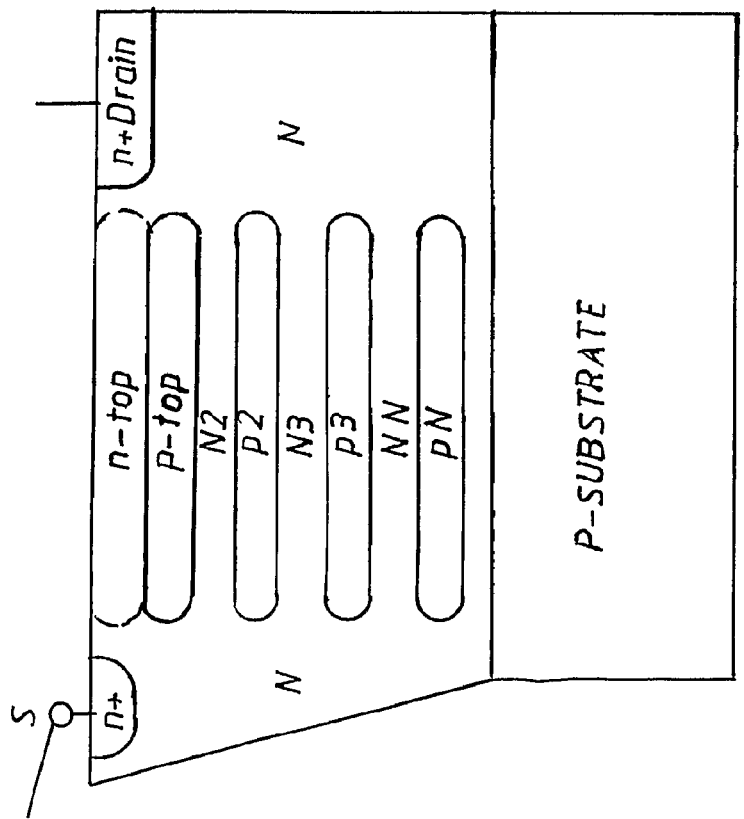
Figure 5B:
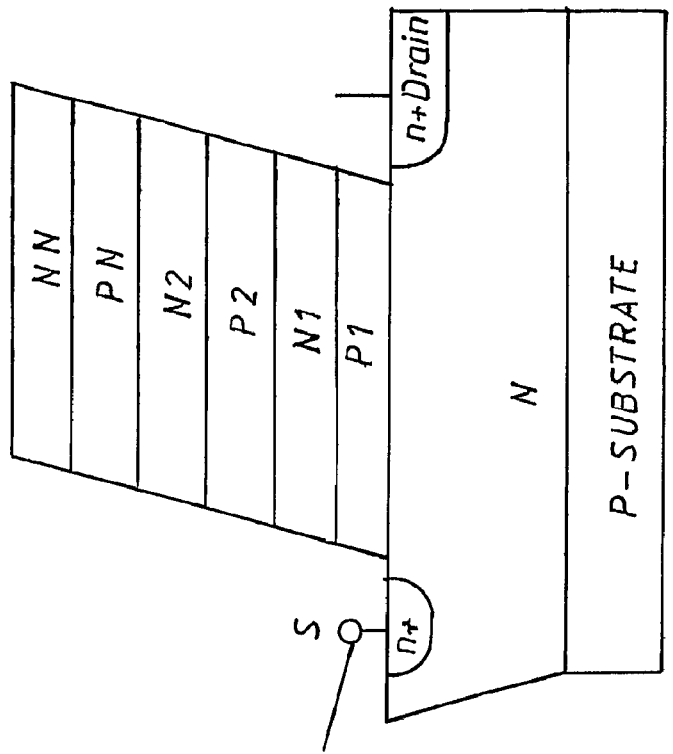
Figure 6:
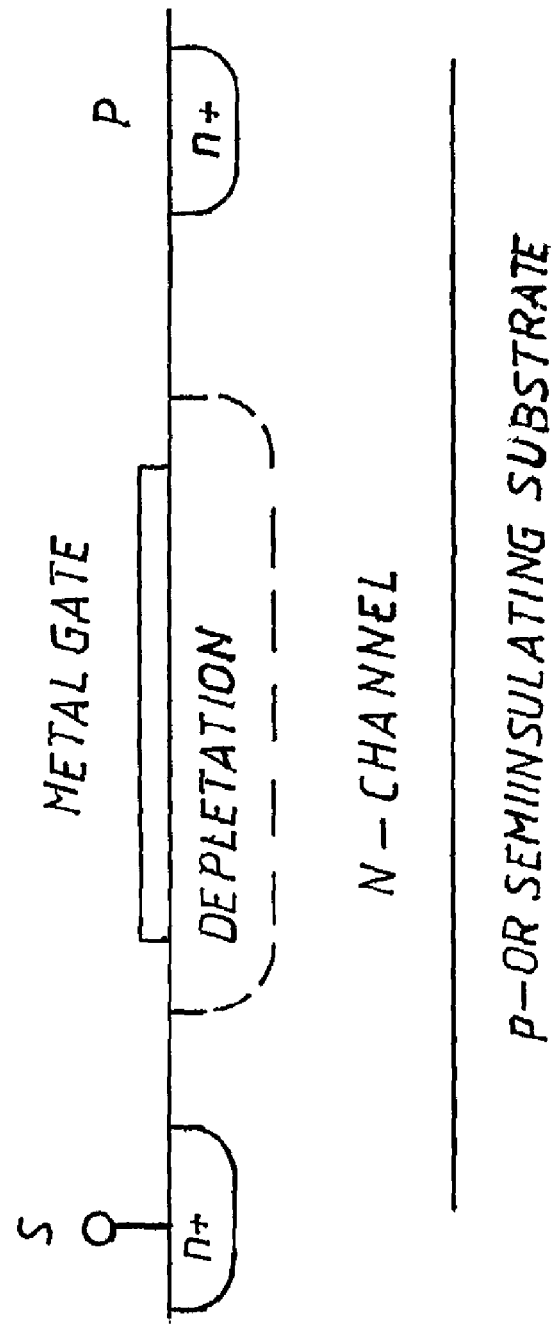

The invention will now be described in further detail with the help of the enclosed drawings, in which FIG. 1 shows a schematic view of a principal implementation of a high voltage LDMOS transistor, FIG. 2 shows the principle of the connection of a MOS transistor and a JFET transistor coupled in series in accordance with the present invention, FIG. 3 shows a non-limiting embodiment of the invention, FIGS. 4a and 4b show two alternative embodiments of the invention, as variants to the one shown in FIG. 3, FIGS. 5a and 5b show two alternative JFET transistors corresponding to the JFET transistor shown on the right hand side of FIG. 2, and FIG. 6 shows an alternative where the JFET has been replaced by a MESFET.

In FIG. 1 is shown a typical principal implementation of a high voltage LDMOS transistor according to U.S. Pat. No. 5,146,298 by the same inventor as the present application. This component can be seen as an internal coupling in series of a MOS transistor and a JFET. The JFET source, Sj, is also the drain, Dm, of the internal MOS transistor. The gate material is made of polysilicon which in accordance with the figure overlaps the channel area. The JFET is decisive for the maximum current. To obtain a high current it is important that the source Sj resistance is small. At an overlapping gate a positive voltage on the gate will increase the concentration of charge carriers in the source Sj, and thereby reduce the resistance in the area, which results in an increased current. The maximum current is deeply dependent on how large the overlap is. For an overlap of 1.0 μm a current of 200 mA is obtained, and which will be reduced to about 140 mA if the overlap is only 0.1 μm.

In FIG. 2 is shown the principal coupling of a MOS in series with a JFET. The source resistance in the JFET is made very low with a n+ diffusion and similarly the drain n+ diffusion for the MOS transistor. If the compound component shall be able to resist a high voltage it is necessary that the pinch voltage, Vp, of the JFET is lower than the breakthrough voltage, Vbr, of the MOS component. The JFET is pinched, i.e. is cut down, at a voltage that is lower than the breakthrough voltage of the MOS transistor. For the same width, W, of the components the current is increased to 250 mA. If on the other hand the width, W, of the MOS transistor is made 3-4 times greater the current is increased to more than 350 mA. If the MOS transistor is made wider, only 2-3V is necessary on the gate to drive the transistor, compared to 10-15V if the transistors have the same width. This means that the component can be driven at the same voltage as the control logics without the necessity of an additional voltage source, which is a big advantage, and also that the power necessary to drive the component can be reduced with a factor 4-5.

E.g. when the width of the insulated gate field effect transistor is made 4 times wider than the width of the JFET the input capacitance of the combined device will be 4 times larger and the gate voltage will be reduced from 12V to 3V. The energy stored in the input capacitor is proportional to $CV^2$, hence the input power for switching will be reduced by a factor of 4.

Further, as the distance between the drain of the JFET and the gate of the insulated gate field effect transistor is increased the capacitance between the drain and the gate is reduced which is very important for high frequency performance.

As the JFET will be pinched off well before breakthrough voltage can occur in the insulated gate field effect transistor, this will be shielded from higher voltages.

This will dramatically reduce the electric field close to the gate of the insulated gate field effect transistor and improve reliability. A high field close to the gate is a major reliability concern in present LDMOS devices.

In FIG. 3 is shown a preferred embodiment of a transistor arrangement according to the invention, showing a diagrammatic view of a MOS transistor 1, as the first insulated gate field effect transistor, in series with a junction field effect transistor 2, as the second field effect transistor, on the same die in accordance with a preferred embodiment of the present invention.

FIG. 3 on the right hand side shows a cross-sectional view of a lateral JFET 2 in series with a MOS transistor 1, on the left hand side, formed on the same semiconductor die.

A substrate 10 of a material of a first conductivity type consists of an epitaxial layer with a thickness of around 12 μm and a resistivity of 10-15 ohmcm on top of a highly doped substrate with a thickness of around 500 μm. A pocket 11 for the JFET of material of second conductivity type is, for example, n-type material doped at $5*10^{12}$ atoms per $cm^2$. Pocket 11 extends to a depth of around 4 μm below a surface 9 of die 8. The doping levels and dimensions given here and below are for a device with breakdown voltage of approximately 200 V. A similar pocket 111 is formed for the MOS transistor on the left hand side in FIG. 3.

Within or partly within pocket 11, and pocket 111 a body region 12 and 121 of first conductivity type, for example p-type material, is doped at between $10^{17}$ and $10^{20}$ atoms per cm$^3$. Body region 12 typically extends to a depth of 1 μm or less below surface 9 of die 8. Within body region for the MOS transistor 121, a source region 131 of second conductivity type is, for example n+ type material, doped at between $10^{18}$ and $10^{20}$ atoms per cm$^3$. Source region 131, extends for example 0.4 μm or less below the surface 9 of the die 8. Body regions 12 and 121 may be electrically connected to the substrate 10 by extending the body regions 12 and 121 outside the pocket regions 11 and 111.

A drain contact region 16 and 161 of second conductivity type, for example n+ type material, is doped at between $10^{18}$ and $10^{20}$ atoms per cm$^3$. Drain contact region 16 and 161 extends, for example, 0.4 μm or less below the surface 9 of the die 8. A source contact region for the JFET 16A similar to the drain contact region 16 is placed between the body region 12 and the drain contact region 16.

A source contact 171 for the MOS transistor, left hand side in FIG. 3, is placed on the surface 9 in electrical contact with the body region 121 and a source contact region portion of source region 131. A drain contact 191 for the MOS transistor is placed on the surface 9 in contact with drain contact region 161. An insulating layer 7 is placed on the surface 9 of the die 8.

A gate contact 181 is placed on the insulating layer 7 over a to channel region portion of the body region 121, as shown. A body contact 17 is placed on the surface 9 in contact with the body region 12. A drain contact 19 is placed on the surface 9 in contact with the drain contact region 16.

A source contact 19A is placed on the surface 9 in contact with source the contact diffusion 16A. Between the source contact region 16A for the JFET, right hand side of FIG. 3, and the drain contact region 16 is a region 14 of second conductivity type. The region 14, for example n-type material, is doped at $2-4*10^{12}$ atoms per cm$^2$. The region 14 extends downward from the surface 9 to a depth, for example 0.4 μm. Located below the region 14 is a region 15 of the first conductivity type. The region 15, for example p-type material, is doped at $5*10^{12}$ atoms per cm$^2$. The region 15 extends from the surface 9 downward to a depth of, for example, 1 μm. The region 15 is connected to ground at the surface 9 in a plane not shown in FIG. 3. A distance 6 between the edge of the source contact region 16A and an edge of the drain contact region 16 is, for example, 6 μm. A symmetry line 20 is used for placing a second half of the transistor in a mirror image to the first half shown in FIG. 3.

The drain contact 191 of the MOS transistor, on the left hand side in FIG. 3, will be electrically connected to the source contact 19A of the JFET, on the right hand side of FIG. 3, and thus constitute a MOS transistor in series with a JFET.

A three terminal switching device is obtained where the source contact is 171, gate contact 181 and drain contact 19.

In another embodiment, if the drain n+ contact area 16 for the JFET in FIG. 3 is surrounded by p+ contact areas which are electrically connected to the n+ are or the n+ area is simply replaced by a p+ area, as shown in FIGS. 4a and 4b, respectively, two different IGBT transistors can be easily implemented.

Besides higher current capability these devices have the same performance advantages as the compound advantages described earlier.

Further these IGBT devices are completely immune from latch up which is a major concern in all IGBT devices.

The bipolar action will take place in device 2 as shown in FIG. 3. In device 2 there is no pnpn structure. The killing structure 121 (p) under 131 (n) has been moved out to device 1.

The JFET 2 in FIG. 3 is actually a parallel connection of a single sided JFET, channel layer 14 and gate layer 15, and a double sided JFET, channel layer 11 and gate layers 15 and 10.

In FIG. 5a is schematically shown how the second field effect transistor can be composed of a number of Ntop and Ptop layers arranged vertically to make up channels and gates of paralleled junction field transistors with a common source region. Similarly FIG. 5b shows schematically how the second field effect transistor can be composed of a number of Ntop and Ptop layers arranged horizontally to make up channels and gates of paralleled junction field transistors with a common source region.

As indicated in FIG. 2 the JFET can also be implemented in a SOI approach, where layer 10 has been replaced by an oxide layer. In this approach the JFET is a parallel connection of two single sided JFETs but the channel region 11 will also be affected from the bottom oxide layer as this will form an additional insulated gate transistor in parallel with the two JFETs.

The JFET in FIG. 2 could also be replaced by a MESFET, as shown in FIG. 6. The metal is earthed and therefore the p-layer will be depleted.

The invention claimed is:

1. A semiconductor device, comprising:
    a first insulated gate field effect transistor connected in series with a second field effect transistor
    wherein the second field effect transistor has a heavily doped source contact region electrically connected to a heavily doped drain contact region of the first insulated gate field effect transistor, and
    wherein the breakthrough voltage of the first insulated gate field effect transistor is higher than the pinch voltage of the second field effect transistor.

2. A device according to claim 1, wherein the second field effect transistor comprises several field effect transistors in parallel with a common heavily doped source contact region.

3. A device according to claim 1, wherein the width W of the first insulated gate field effect transistor is at least 2 times larger than the width W of the second field effect transistor.

4. A device according to claim 1, wherein the second field effect transistor is a junction field effect transistor, JFET.

5. A device according to claim 1, wherein the second field effect transistor is an insulated gate field effect transistor.

6. A device according to claim 1, wherein the second field effect transistor with modified drain contact region connected in series with the first insulated gate field effect transistor is an insulated gate bipolar transistor.

7. A device according to claim 1, wherein the first insulated gate field effect transistor and the second field effect transistor are arranged on different substrates.

8. A device according to claim 1, wherein the first insulated gate field effect transistor and the second field effect transistor are arranged on a common substrate.

9. A device according to claim 1, wherein the first insulated gate field effect transistor and the second field effect transistor are merged together, and that the drain contact region for the first insulated gate field effect transistor is the same as source contact region for the second transistor device.

10. A device according to claim 1, wherein both the first insulated gate field effect transistor and the second field effect transistor are incorporated in a surface region of the substrate.

11. A device according to claim 4, wherein the second field effect transistor comprises a number of Ntop and Ptop layers arranged vertically to make up channels and gates of paralleled junction field effect transistors with a common source region.

12. A device according to claim 4, wherein the second field effect transistor comprises a number of Ntop and Ptop layers arranged horizontally to make up channels and gates of paralleled junction field effect transistors with a common source region.

13. A semiconductor device, comprising:
  a first insulated gate field effect transistor connected in series with a second field effect transistor
  wherein the second field effect transistor has a heavily doped source contact region electrically connected to a heavily doped drain contact region of the first insulated gate field effect transistor,
  wherein the breakthrough voltage of the first insulated gate field effect transistor is higher than the pinch voltage of the second field effect transistor, and
  wherein the second field effect transistor is a combination of one or more junction field transistors and one or more insulated gate field transistors, all with a common source contact diffusion.

14. A semiconductor device, comprising:
  a first insulated gate field effect transistor connected in series with a second field effect transistor
  wherein the second field effect transistor has a heavily doped source contact region electrically connected to a heavily doped drain contact region of the first insulated gate field effect transistor,
  wherein the breakthrough voltage of the first insulated gate field effect transistor is higher than the pinch voltage of the second field effect transistor,
  wherein the second field effect transistor is a junction field effect transistor, JFET and,
  wherein the second field effect transistor comprises a number of Ntop and Ptop layers arranged one of i) vertically to make up channels and gates of paralleled junction field effect transistors with a common source region, and ii) horizontally to make up channels and gates of paralleled junction field effect transistors with a common source region.

* * * * *